(12) United States Patent
Hong et al.

(10) Patent No.: US 10,553,452 B2
(45) Date of Patent: Feb. 4, 2020

(54) PRINTED CIRCUIT BOARD, METHOD, AND SEMICONDUCTOR PACKAGE

(71) Applicant: SAMSUNG ELECTRO-MECHANICS CO., LTD., Suwon-si (KR)

(72) Inventors: Suk-Chang Hong, Cheongju-si (KR); Hyo-Bin Park, Daejeon (KR); Dong-Kwang Shin, Daejeon (KR); Sang-Jin Baek, Sejong (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/165,462

(22) Filed: May 26, 2016

(65) Prior Publication Data
US 2016/0351545 A1    Dec. 1, 2016

(30) Foreign Application Priority Data
Jun. 1, 2015   (KR) .................. 10-2015-0077303

(51) Int. Cl.
*H01L 21/48* (2006.01)
*H01L 23/538* (2006.01)
(Continued)

(52) U.S. Cl.
CPC ........ *H01L 21/486* (2013.01); *H01L 21/4857* (2013.01); *H01L 21/6835* (2013.01); *H01L 23/13* (2013.01); *H01L 23/36* (2013.01); *H01L 23/49822* (2013.01); *H01L 23/49827* (2013.01); *H01L 23/49833* (2013.01); *H01L 23/5385* (2013.01); *H01L 23/5389* (2013.01); *H01L 25/105* (2013.01); *H01L 23/3128* (2013.01); *H01L 23/49816* (2013.01); *H01L 24/16* (2013.01); *H01L 24/32* (2013.01); *H01L 24/48* (2013.01); *H01L 24/73* (2013.01); *H01L 2221/68345* (2013.01); *H01L 2221/68359* (2013.01); *H01L 2224/16227* (2013.01); *H01L 2224/16235* (2013.01); *H01L 2224/32145* (2013.01); *H01L 2224/32225* (2013.01); *H01L 2224/48096* (2013.01); *H01L 2224/48097* (2013.01); *H01L 2224/48227* (2013.01); *H01L 2224/73253* (2013.01); *H01L 2224/73265* (2013.01); *H01L 2225/0651* (2013.01); *H01L 2225/06568* (2013.01); *H01L 2225/107* (2013.01); *H01L 2225/1023* (2013.01);
(Continued)

(58) Field of Classification Search
CPC ............... H05K 2201/0723; H05K 2201/0707
See application file for complete search history.

(56) References Cited

U.S. PATENT DOCUMENTS 5,986,209 A      11/1999   Tandy
2005/0112864 A1*  5/2005   Clevenger ......... H01L 21/76805
                                                          438/622
(Continued)

*Primary Examiner* — Matthew L Reames
*Assistant Examiner* — Steven B Gauthier
(74) *Attorney, Agent, or Firm* — NSIP Law

(57) ABSTRACT

A printed circuit board includes first and second insulating layers forming a cavity, a first heat releasing layer formed on an exterior surface of the cavity, and a circuit layer formed above or below the first insulating layer and at least between a surface of the cavity and the first insulating layer. The heat releasing layer is electrically connected to at least a portion of the circuit layer.

7 Claims, 7 Drawing Sheets

(51) Int. Cl.
*H01L 21/683* (2006.01)
*H01L 23/498* (2006.01)
*H01L 23/36* (2006.01)
*H01L 25/10* (2006.01)
*H01L 23/13* (2006.01)
*H01L 23/31* (2006.01)
*H01L 23/00* (2006.01)

(52) U.S. Cl.
CPC .................. *H01L 2225/1094* (2013.01); *H01L 2924/00014* (2013.01); *H01L 2924/15153* (2013.01); *H01L 2924/15311* (2013.01); *H01L 2924/15331* (2013.01)

(56) References Cited

U.S. PATENT DOCUMENTS

| | | | |
|---|---|---|---|
| 2006/0180344 A1* | 8/2006 | Ito | H01L 23/5385 174/262 |
| 2012/0129298 A1* | 5/2012 | Lin | H01L 25/16 438/118 |
| 2013/0220535 A1* | 8/2013 | Lee | H05K 3/4644 156/268 |
| 2016/0276307 A1* | 9/2016 | Lin | H01L 21/561 |

* cited by examiner

PRINTED CIRCUIT BOARD, METHOD, AND SEMICONDUCTOR PACKAGE

CROSS REFERENCE TO RELATED APPLICATIONS

This application claims the benefit under 35 USC § 119(a) of Korean Patent Application No. 10-2015-0077303, filed on Jun. 1, 2015 with the Korean Intellectual Property Office, the entire disclosure of which is incorporated herein by reference for all purposes.

BACKGROUND

1. Field

The following description relates to a printed circuit board, method, and semiconductor package.

2. Description of Related Art

The electronics industry has adopted mounting technologies using multi-layer printed circuit boards which are possible for high-density and high-integrated mountings in response to demands for electronic devices with lighter weights and smaller sizes. Such technologies using multi-layer printed circuit boards have progressed to implement high-density and high-integrated mountings with development of element technologies such as fine circuits, bumps and the like. Recently, there has been development of semiconductor packages in which electronic components are pre-mounted on a printed circuit board, such as system in package (SIP), chip sized package (CSP), and flip chip package (FCP). In addition, an integrated circuit packaging method (Package On Package; POP), which combines control components and memory components in a single package, has been introduced to miniaturize smartphones and improve performance. The integrated circuit package can be formed by individually packaging control components and memory components and then laminating and connecting the packaged components.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes first and second insulating layers forming a cavity, a first heat releasing layer formed on an exterior surface of the cavity, and a circuit layer formed above or below the first the insulating layer and at least between a surface of the cavity and the first insulating layer. The first heat releasing layer is electrically connected to at least a portion of the circuit layer.

The first heat releasing layer may include a conductive metal.

The printed circuit board may be a semiconductor package, wherein the first and second insulating layers, the first heat releasing layer, and the circuit layer may make up a second printed circuit board of the semiconductor package. The semiconductor package may further include a first printed circuit board having a first component disposed on a top portion of the first printed circuit board, a third printed circuit board having a second component disposed on a top portion of the third printed circuit board, a second heat releasing layer formed on the second component and in contact and electrical contact with the first heat releasing layer on an exterior surface of the cavity, with the second component being at least partially fixed inside the cavity.

The first and second heat releasing layers may include a conductive metal.

The heat releasing member may be disposed between the first component and the first heat releasing layer.

The heat releasing member may contact at least one of an upper surface of the first component or a side surface of the first component.

The heat releasing member may include a conductive paste.

In another general aspect, a method for manufacturing a printed circuit board includes forming a first insulating layer on a surface of a carrier board, wherein the carrier board includes a carrier core and carrier metal layer, forming a first circuit layer on the first circuit layer, forming a second insulating layer above the first portion of the first circuit layer so as to form a cavity above a second portion of the first circuit layer, forming a metal layer on the second insulating layer, removing the carrier core, forming a heat releasing layer on the first portion of the first circuit layer inside of the cavity and on remaining exterior walls inside of the cavity, and forming a second circuit layer by patterning the metal layer.

The forming of the heat releasing layer may include forming the heat releasing layer through electroplating.

The heat releasing layer may include a conductive metal.

The heat releasing layer may be formed to contact a surface of the first circuit layer externally exposed in the cavity.

The forming of the heat releasing layer may include selectively forming the heat releasing layer on a surface of the metal layer.

The forming of the heat releasing layer may include forming the heat releasing layer on another surface of the carrier metal layer.

The removing of the carrier board may include separating the carrier core from the carrier metal layer.

A third circuit layer may be formed by patterning a carrier metal layer and a heat releasing layer on another side of the first insulating layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
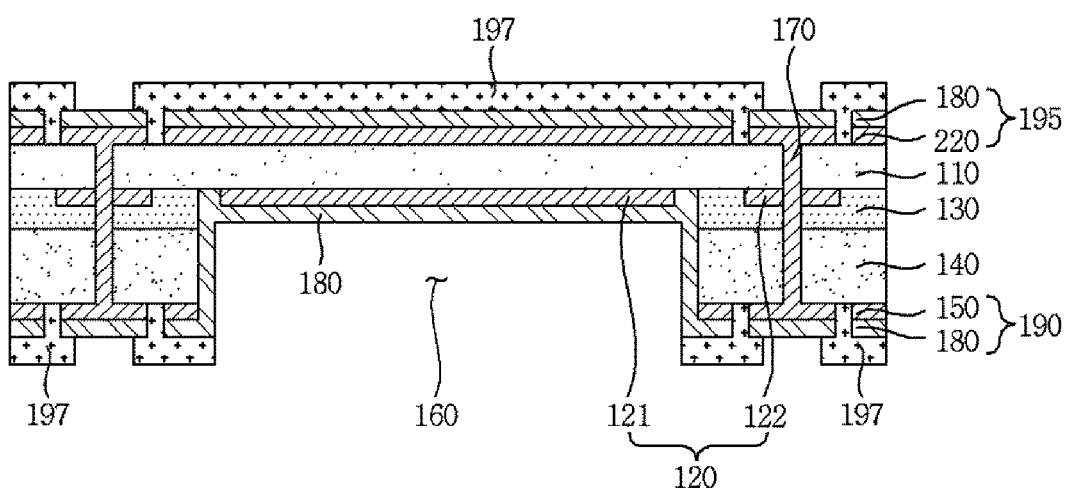
FIG. 1 is a diagram illustrating a printed circuit board, according to one or more embodiments.

The following detailed description is provided to assist the reader in gaining a comprehensive understanding of the methods, apparatuses, and/or systems described herein.

However, after an understanding of the following description, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order, after an understanding of the following description.

The features described herein may be embodied in different forms, and are not to be construed as being limited to the examples described herein. Rather, the examples described herein have been provided so that this disclosure will be thorough, and will convey the disclosure to one of ordinary skill in the art.

It will be understood that, although any of the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Similarly, when it is described that a method includes series of operations, a sequence of the operations is not a sequence in which the operations should be performed in the sequence, an arbitrary technical operation may be omitted and/or another arbitrary operation, which is not disclosed herein, may be added to the method.

Unless indicated otherwise, any statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as any of "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Hereinafter, embodiments of the present disclosure will be described in detail with reference to the accompanying drawings.

FIG. 1 is a diagram illustrating a printed circuit board, according to one or more embodiments.

Referring to FIG. 1, a printed circuit board 100 according to one or more embodiments includes an insulating layer, a circuit layer, and a heat releasing layer 180, for example. A cavity 160 may be formed in a concave shape on one surface, for example, a lower surface, of the insulating layer. The insulating layer includes a first insulating layer 110 and a second insulating layer 140.

Hereinafter, a referenced insulating layer may be formed of any composite polymer resin having insulation properties, for example, a prepreg, an ajinomoto build-up film (ABF), or an epoxy resin such as FR-4, BT (bismaleimide triazine). However, the material for forming such an insulating layer is not limited thereto and different insulating layers may be made of different materials. Thus, the first insulating layer 110 and the second insulating layer 140, depending on embodiment, may be respectively formed of any suitable insulation material.

The circuit layer may be formed on one surface of and inside the insulating layer. The circuit layers may include a first circuit layer 120, a second circuit layer 190 and a third circuit layer 195, for example.

In the embodiment of FIG. 1, the first circuit layer 120 is formed on a surface of the first insulating layer 110. For example, further referring to FIG. 1, the one surface is a lower surface and the other surface is an upper surface.

The first circuit layer 120 includes a ground pattern 121 and a signal pattern 122. For example, the ground pattern 121 may be disposed adjacent to the portion where the cavity 160 is formed. In this example, the ground pattern 121 is formed adjacent to the portion where the cavity 160 is formed but it may not be limited thereto. For example, rather than the ground pattern 121, the signal pattern 122 may also be formed adjacent to the portion where the cavity 160 is formed.

The second circuit layer 190 may be formed on a surface, for example a lower surface, of the second insulating layer 140. As shown in FIG. 1, in an embodiment, a part of the second circuit layer 190 may be in contact with the heat releasing layer 180.

The third circuit layer 195 may be formed on another surface of the first insulating layer 110, for example the upper surface of the insulating layer 110.

Hereinafter, a referenced circuit layer may be formed of any conductive material, for example, of copper, and different circuit layers may be formed of the same or different conductive materials.

In an embodiment, the heat releasing layer 180 is formed inside the cavity 160. In this embodiment, the heat releasing layer 180 forms an inner wall and the upper surface of the cavity 160. The heat releasing layer 180 formed on the upper surface of the cavity 160 may be in contact with the first circuit layer 120. Here, the heat releasing layer 180 may be electrically connected with the ground pattern 121. For example, the heat releasing layer 180 may therefore transfer heat to the ground pattern 121 to improve heat releasing performance of the printed circuit board 100.

The printed circuit board 100 may further include a through via 170, an adhesion layer 130, and a protection layer 197, for example.

In an embodiment, the through via 170 electrically connects the first circuit layer 120 to the third circuit layer 195 by passing through the first insulating layer 110 and the second insulating layer 140. The circuit layer electrically connected with the through via 170 may be modified according to a desired design, depending on embodiment.

Hereinafter, a through via may be formed of any conductive material, for example, copper, and different through vias may be formed of the same or different conductive materials.

The adhesion layer 130 may be formed or disposed on the first insulating layer 110 and the second insulating layer 140. In an embodiment, the signal pattern 122 is disposed between the first insulating layer 110 and the adhesion layer 130. The adhesion layer 130 may be formed of any non-conductive adhesive material, depending on embodiment.

The protection layer 197 is disposed on an upper and/or lower surface of the printed circuit board to cover and protect the second circuit layer 190 and the third circuit layer 195, for example. Here, the protection layer 197 is configured to, for example, externally expose the portion of the second circuit layer 190 and third circuit layer 195 which are to be electrically connected with an external component. The protection layer 197 may be formed of a heat-resistant coating material. For example, the protection layer 197 may be a solder resist, noting that alternatives are available. In one or more embodiments, a surface treatment layer may also be further formed on the circuit layer which is external exposed by the protection layer 197.

Figure 2:
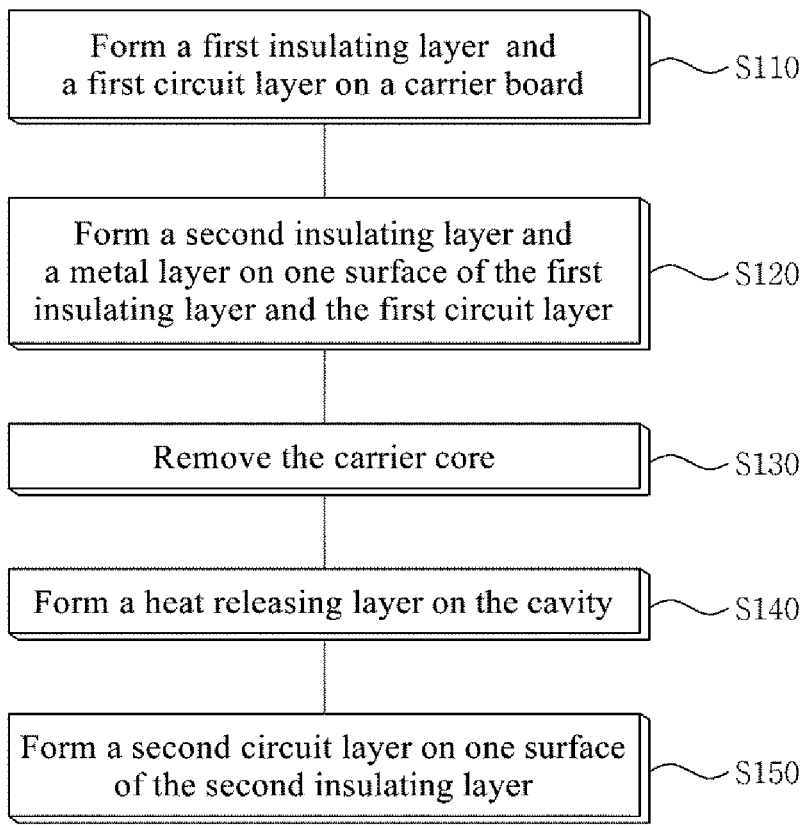
FIG. 2 is a flowchart illustrating a method for manufacturing a printed circuit board, according to one or more embodiments.

FIG. 2 is a flowchart illustrating a method for manufacturing a printed circuit board, according to one or more embodiments. FIG. 3 to FIG. 12 are diagrams illustrating methods for manufacturing a printed circuit board, according to one or more embodiments.

The flowchart of FIG. 2 is an example of a method for manufacturing a printed circuit board and will be explained in detail with reference to the diagrams of FIG. 3 to FIG. 12.

The following description discloses a method for manufacturing a printed circuit board on one surface of a carrier board 200. The method may operation of FIG. 2 may further be repeated, or simultaneously carrying out one or more of the operations of FIG. 2, on another surface of the carrier board 200, to form one or more circuits according to one or more embodiments.

Figure 3:
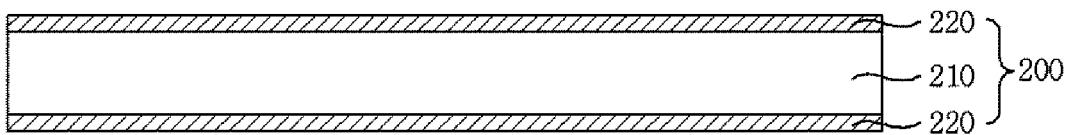
FIG. 3 to FIG. 12 are diagrams illustrating methods for manufacturing a printed circuit board, according to one or more embodiments.
Figure 4:
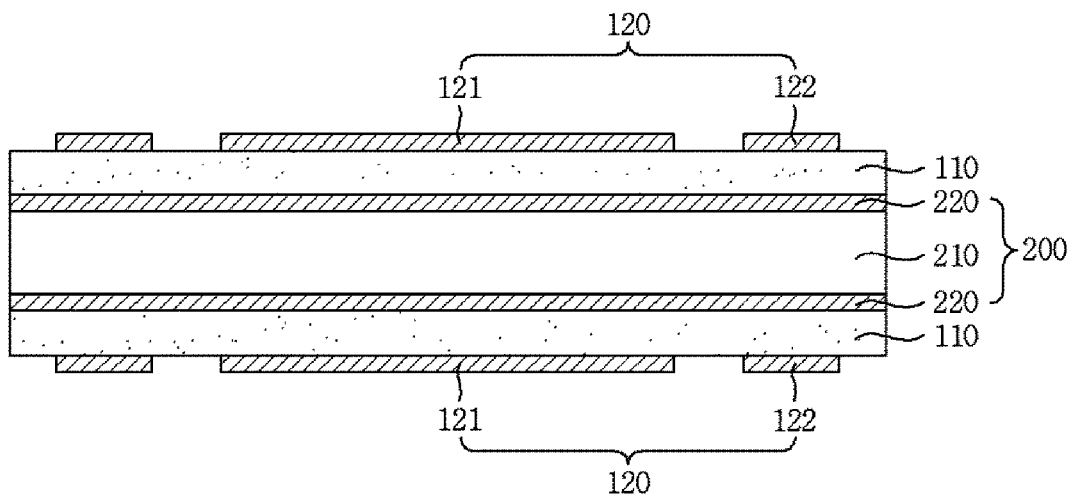

Referring to FIG. 3 and FIG. 4, a first insulating layer 110 and a first circuit layer 120 are formed on the carrier board 200 as in S110 of FIG. 2.

Referring to FIG. 3, the carrier board 200, for supporting an insulating layer and a circuit layer of the printed circuit board, may be a laminated structure in which a carrier metal layer 220 is laminated on a carrier core 210, as an example. In an embodiment, the carrier core 210 is formed of an insulating material. However, the material for forming the carrier core 210 is not limited thereto. For example, the carrier core 210 may be formed of a metallic material or one or more layers of a laminate structure of an insulating layer and a metal layer, as only an example. For example, the metallic material may be formed of copper. However, the metallic material is not limited to copper. For example, the carrier metal layer 220 may be formed of any conductive material.

A layer of the carrier metal layer 220 may be laminated on both surfaces of the carrier core 210 to form the carrier board. However, the structure of the carrier board 200 is not limited thereto. For example, the carrier board 200 may be formed by laminating multilayered metal layers on the carrier core and a release layer is formed between the multilayered metal layers. Thus, when the release layer is separated, the carrier board, except the metal layer formed on the outmost layer, is separated and removed from the printed circuit board.

Referring to FIG. 4, a first insulating layer 110 and a first circuit layer 120 is disposed on a surface of the carrier board 200. Specifically, the first insulating layer 110 formed on a surface of the carrier metal layer 220 of the carrier board 200.

For example, in addition to the above examples for referenced insulation layers, the carrier metal layer 220 may also be coated by a liquid insulator which solidifies into the first insulating layer 110. Still further, as another example for insulation layer formation, the first insulating layer 110 may also be laminated and pressed in a film form onto the carrier metal layer 220, or formed through other methods depending on embodiment.

In addition to any above examples for forming the conductive layers or patterns, the first circuit layer 120 is disposed on one surface of the first insulating layer 110. The first circuit layer 120 may also be formed through electroless plating, electroplating, or by laminating a metallic foil on the first insulating layer 110, as only examples. The first circuit layer 120 may be formed of any conductive material, for example, copper. In an embodiment, the first circuit layer 120 includes a ground pattern 121 and a signal pattern 122.

Figure 5:
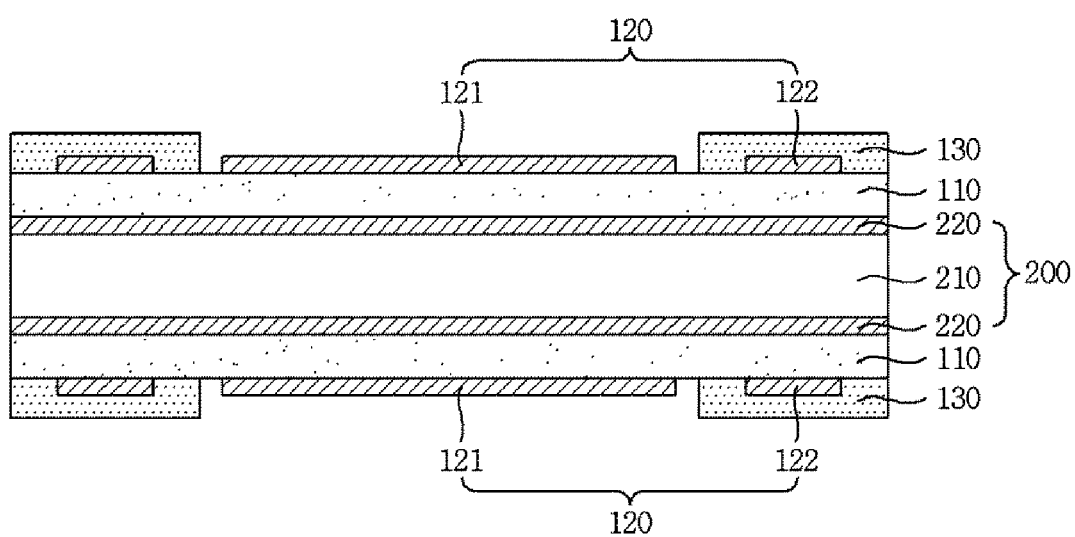
Figure 6:
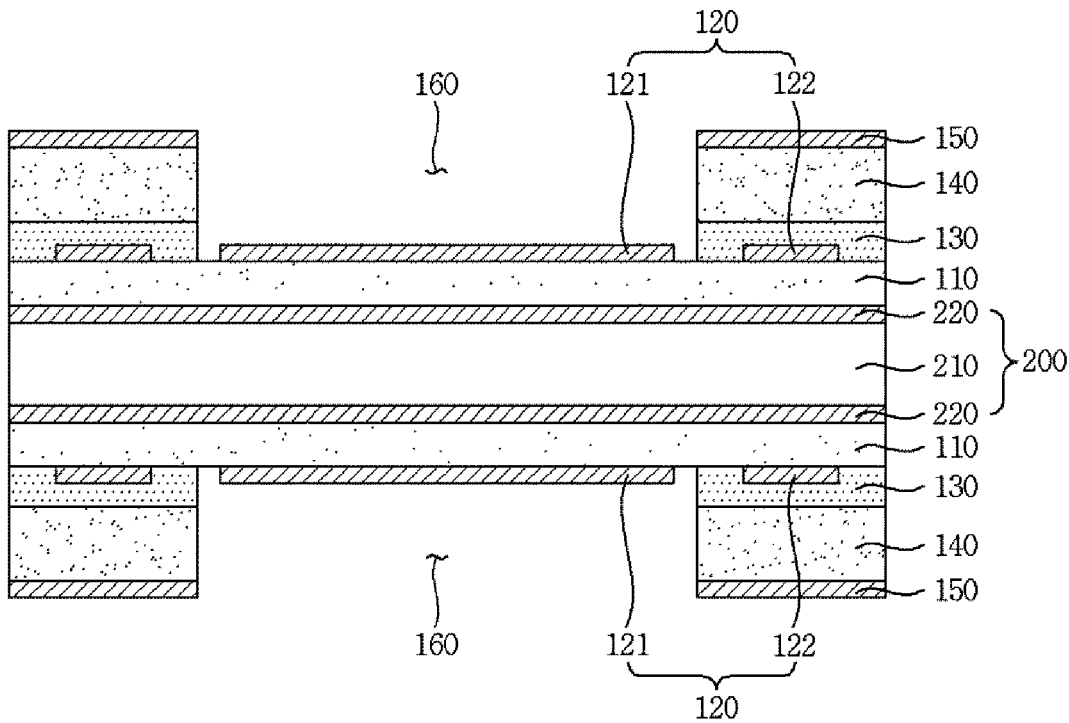

Referring to FIG. 5 and FIG. 6, a second insulating layer 140 and a metal layer 150 are formed on a surface of the first insulating layer 110 and the first circuit layer 120, in S120 of FIG. 2, e.g., after an adhesion layer 130 is formed on the signal pattern 122 and a portion of the upper surface of the first insulating layer 110 surrounding the signal pattern 122. The adhesion layer 130 is a non-conductive adhesive material.

As noted, as illustrated in FIG. 6, the second insulating layer 140 and the metal layer 150 are disposed on the adhesion layer 130. For example, the metal layer 150 may be laminated on one surface of the second insulating layer 140. Here, the second insulating layer 140 and the metal layer 150 are formed on one surface of the adhesion layer 130, such as wherein a portion of the second insulating layer 140 and the metal layer 150 has been selectively processed and/or removed to form a cavity 160. For example, the ground pattern 121 defines an edge of the cavity 160, thereby being made exposed to the exterior of the printed circuit 100, in an operation. The signal pattern 122 is disposed beneath the second insulating layer 140 within the adhesion layer 130.

In this example, the cavity 160 is formed to be adjacent to the ground pattern 121. In other words the cavity 160 is above or below the ground pattern 121. However, the printed circuit 100 is not limited thereto. For example, the signal pattern 122 may be adjacent to the cavity 160 if desired, depending on embodiment. The metal layer 150 may be formed of any conductive material, for example, copper.

For example, the second insulating layer 140 and the metal layer 150 are attached to each other and then may be laminated onto the adhesion layer 130. However, the method is not limited thereto. For example, after forming the second insulating layer 140 on one surface of the adhesion layer 130, the metal layer 150 may be formed or disposed on the insulating layer 140. Additionally, the operation for forming an adhesion layer 130 may be omitted if desired, depending on embodiment.

Figure 7:
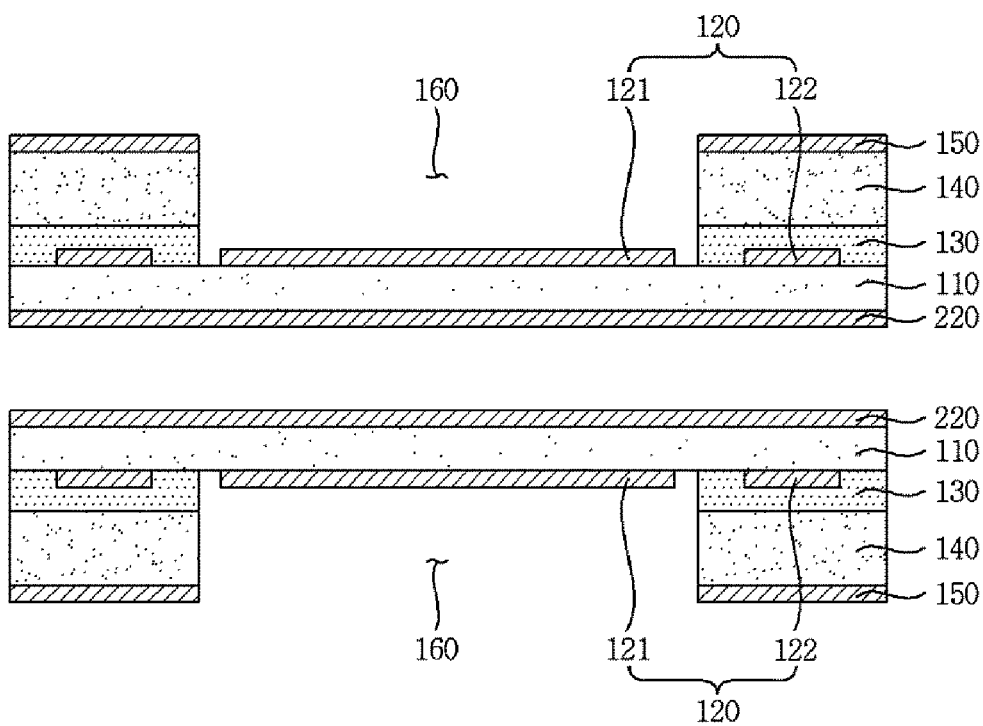

Referring to FIG. 7, the carrier core (210 in FIG. 6) is removed, as in S130 of FIG. 2, leaving the respective carrier metal layers 220 attached to the respective surfaces of the first insulating layers 110.

Figure 8:
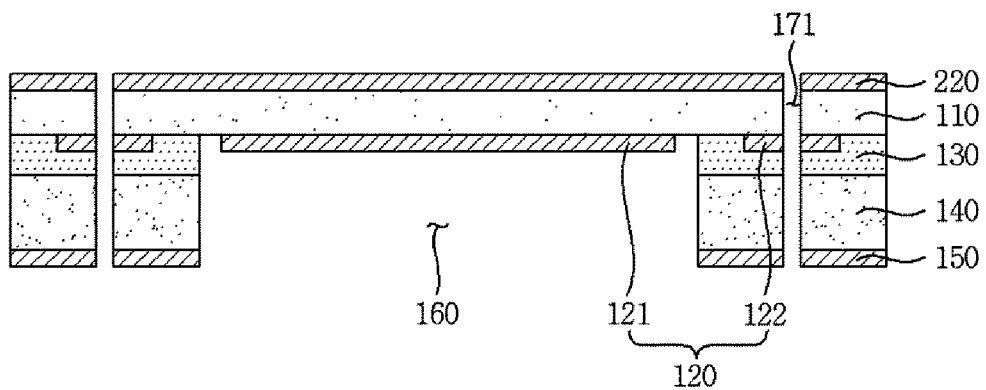

Referring to FIG. 8, a through hole 171 may be formed to extend from the carrier metal layer 220 to the metal layer 150. Here, the through hole 171 may be formed extend through the signal pattern 122 of the first circuit layer 120. As an example, the through hole 171 may be formed by using a laser drill or a CNC drill. However, the method for forming the through hole 171 is not limited thereto.

Figure 9:
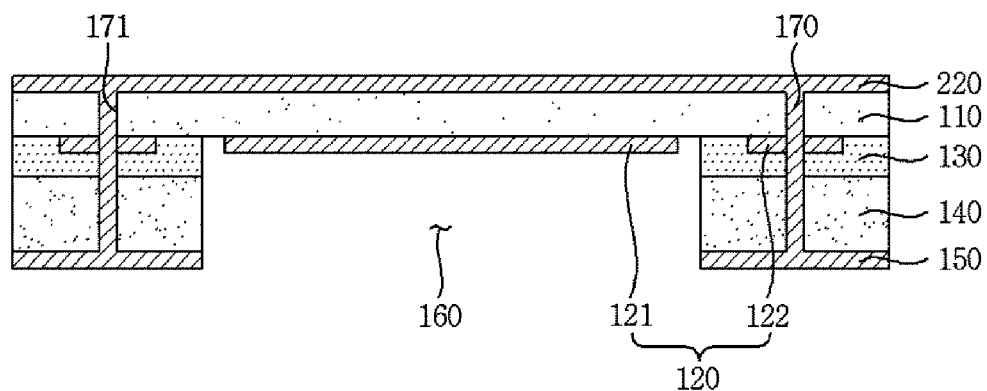

Referring to FIG. 9, a through via 170 is formed by filling the through hole 171 with a conductive material. Accordingly, in an embodiment, the through via 170 extends from an outer surface the carrier metal layer 220 to the outer surface of the metal layer 150. Further, in such an embodiment, the distal edges of the through via 170 and the outer surfaces of the carrier metal layer 220 and metal layer 150 may be coplanar, respectively. Additionally, here, the through via 170 may electrically connect the signal pattern 122 of the first circuit layer 120 with the carrier metal layer 220.

The through via 170 may be formed through an electroplating or a screen printing method, however, the method of forming the through via 170 is not limited thereto. The through via 170 may be formed of any conductive material, for example copper.

Figure 10:
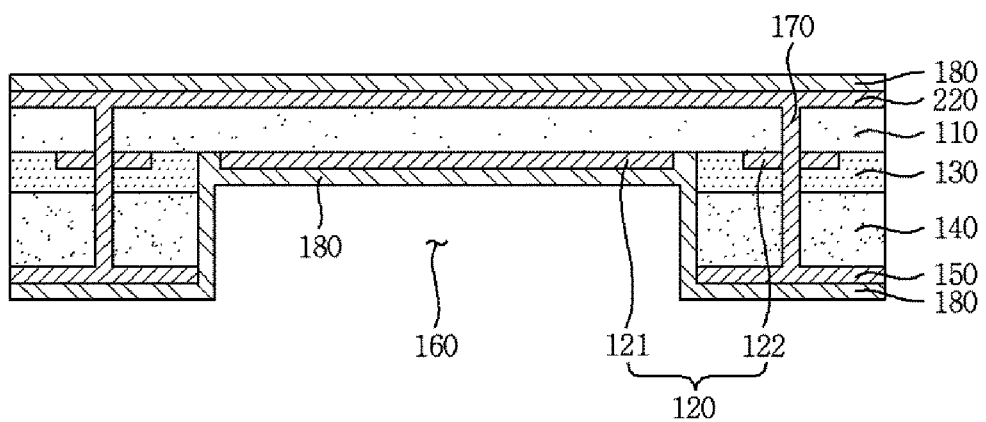

Referring to FIG. 10, a heat releasing layer 180 may be formed along the cavity 160 as in S140 of FIG. 2, including inside walls and an upper surface of the cavity 160, and an outer surface of the metal layer 150.

The heat releasing layer 180 in contact with the ground pattern 121 of the first circuit layer 120, may thus cover the first circuit layer 120 which is externally exposed by the cavity 160. In other words, the heat releasing layer 180 is electrically connected with the ground pattern 121. The heat releasing layer 180 transfers heat directly to the ground pattern 121 in order to improve heat releasing performance. The heat releasing layer 180 may be formed of any conductive material for example, copper.

Figure 11:
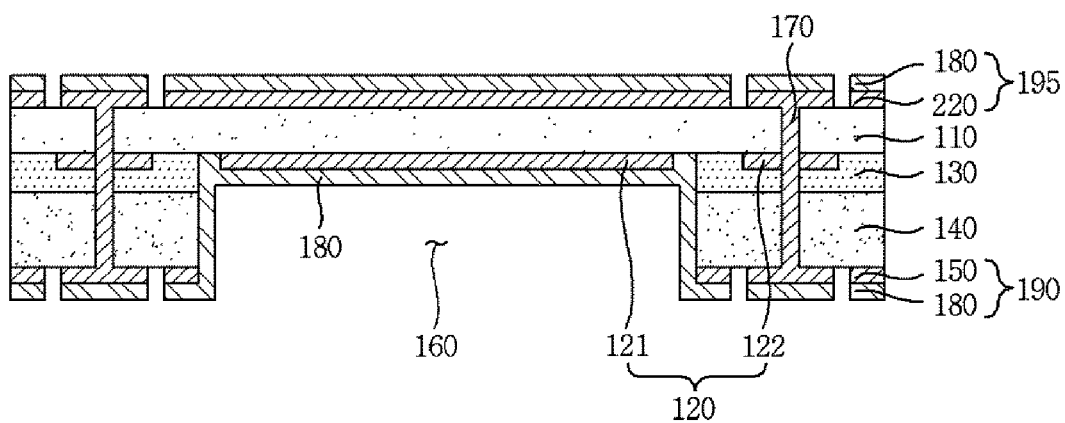

Referring to FIG. 11, a second circuit layer 190 is formed on one surface of the second insulating layer in S150 of FIG. 2. As an example, the second circuit layer 190 may be formed by patterning the metal layer 150 and the heat releasing layer 180 formed on the surface of the second insulating layer 140. As shown in FIG. 10, the heat releasing layer 180 contacts the metal layer 150 formed on one surface of the second insulating layer 140. When the second circuit layer 190 is formed, a third circuit layer 195 may also be formed such a by patterning of the carrier metal layer 220 and the heat releasing layer 180 formed on the other surface of the first insulating layer 110.

The method for patterning to form the second circuit layer 190 and the third circuit layer 195 may be any patterning method, for example photolithography or etching, though embodiments are not limited thereto.

Figure 12:
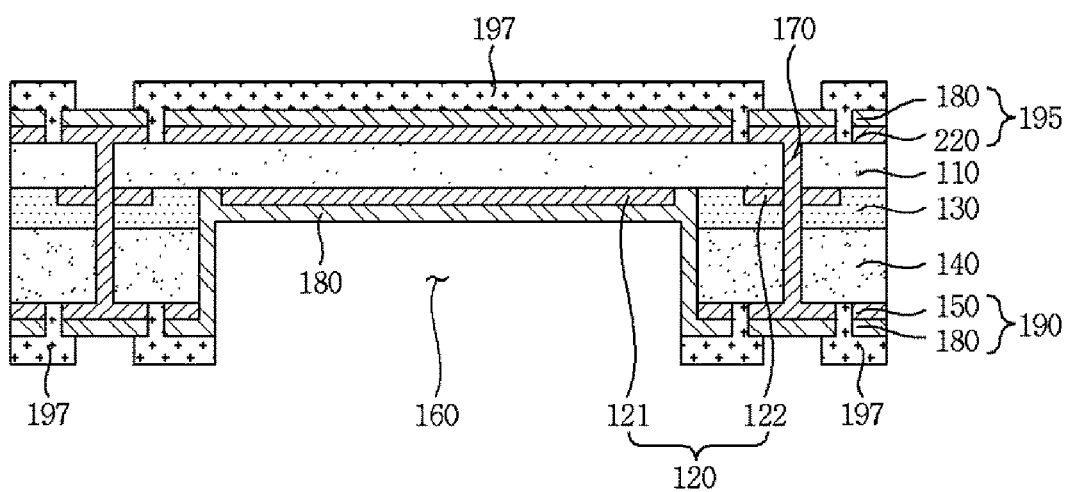

Referring to FIG. 12, protection layers 197 may be formed on the outer surface of the printed circuit board 100 to cover and protect the second circuit layer 190. Here, the protection layer 197 is configured to expose a select portion of the second circuit layer 190, so that an external component can be electrically connected to the second circuit layer.

The protection layer 197 may also be formed on the other side of the first insulating layer 110, e.g. an upper surface of the third circuit layer 195, to cover and protect the third circuit layer 195. Here, the protection layer 197 is configured to externally expose a select portion of the third circuit layer 195, where an external component is to be electrically connected to the third circuit layer 195. For example, the protection layer 197 is a heat-resistant coating material, such as a solder resist. A surface treatment layer may then be formed on the select portion of the second circuit layer 190 and the select portion of the third circuit layer 195 exposed to the outside by the protection layer 197.

Figure 13:
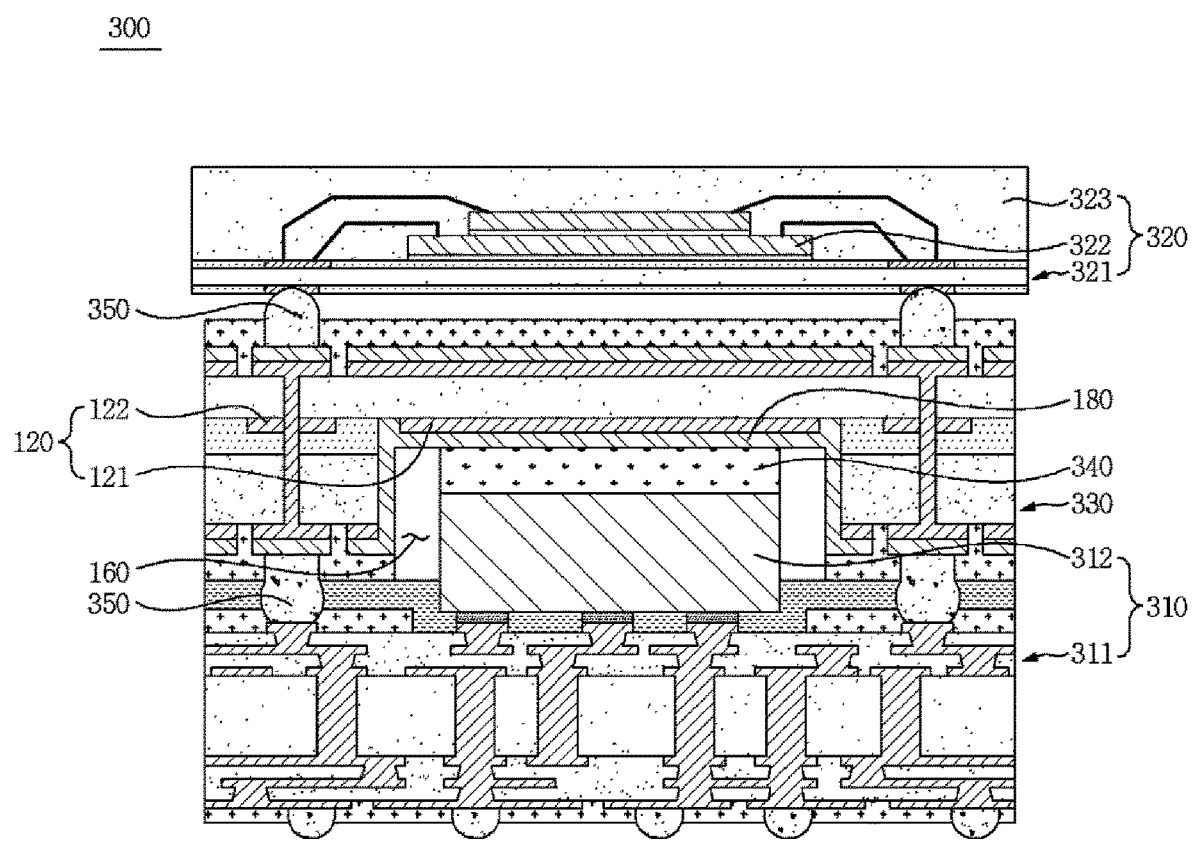
FIG. 13 is a diagram illustrating a semiconductor package, according to one or more embodiments.

FIG. 13 is a diagram illustrating a semiconductor package, according to one or more embodiments.

Referring to FIG. 13, a semiconductor package 300, according to one or more embodiments is a multilayered semiconductor package including a lower package 310, an upper package 320 and a second printed circuit board 330. For example, the second circuit board 330 may have a configuration the same or similar to the printed circuit board 100 of FIG. 12.

The lower package 310 includes a first printed circuit board 311 and a first component 312. Here, the first printed circuit board 311 includes one or more layers of an insulating layer and a circuit layer. The first component 312 is mounted on and electrically connected to an upper surface of the first printed circuit board 311.

The upper package 320 is mounted on an upper part of the second printed circuit board 330. The upper package 320 includes a third printed circuit board 321 and a second component 322. The second printed circuit board 330 may be formed in one or more layers of an insulating layer and a circuit layer, such as discussed with regards to FIGS. 2-12, with circuit layer 120 having a ground pattern 121 and a signal pattern 122, as only examples. The second component 322 is mounted on and electrically connected to an upper surface of the third printed circuit board 321. As an example, the upper package 320 may include a molding material 323 to cover and protect the second component 322.

The second printed circuit board 330 is formed or disposed between the upper package 320 and the lower package 310. The second printed circuit board 330 may be electrically connected with the upper package 320 and the lower package 310 through an external connection terminal 350. That is, the second printed circuit board 330 may function as an interposer in the semiconductor package 300 between the first printed circuit board 311 connected to the first component 312 and third printed circuit board 321 connected to the second component 322.

The second printed circuit board 330 may be formed on the upper part of the lower package 310. Here, the second printed circuit board 330 is formed on the upper part of the first printed circuit board 311 and at least a part of the first component 312 is inserted into the cavity 160.

A heat releasing member 340 is formed between the first component 312 and the heat releasing layer 180 of the second printed circuit board 330. Here, one surface (the lower surface) of the heat releasing member 340 contacts the first component 312 and the other surface (the upper surface) contacts the heat releasing layer 180. Thus, the heat releasing member 340 transfers heat from the first component 312 directly to the heat releasing layer 180. Since the heat from the first component 312 can be transferred to the heat releasing layer 180 through the heat releasing member 340 having high thermal conductivity as compared with air, the heat releasing performance of the semiconductor package 300 is improved.

The heat releasing member 340 may be formed of a conductive paste. However, the material of the heat releasing member 340 is not limited thereto. The heat releasing member 340 may be formed of any material which has high thermal conductivity.

As a non-exhaustive example only, a device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   first and second insulating layers forming a cavity;
   a circuit layer formed on the first insulating layer in the cavity and including a ground pattern; and
   a heat releasing layer disposed in contact with the circuit layer and the first and second insulating layers in the cavity, wherein the heat releasing layer comprises a conductive metal, is electrically connected to the circuit layer, and encapsulates the ground pattern.

2. A printed circuit board comprising:
   first and second insulating layers forming a cavity;
   a circuit layer formed on the first insulating layer in the cavity and including ground pattern; and
   a heat releasing layer disposed in contact with the circuit layer and the first and second insulating layers in the cavity,
   wherein the heat releasing layer is electrically connected to the circuit layer and encapsulates the ground pattern, and
   wherein the printed circuit board is a second printed circuit board of a structure, the structure further comprising:
   a first printed circuit board having a first component disposed on the first printed circuit board; and
   a third printed circuit board having a second component disposed on the third printed circuit board, the first component being at least partially fixed inside the cavity.

3. The printed circuit board of claim 2, wherein the heat releasing layer comprises a conductive metal.

4. The printed circuit board of claim 2, further comprising a heat releasing member disposed between the first component and the heat releasing layer.

5. The printed circuit board of claim 4, wherein the heat releasing member contacts the first component and the heat releasing layer.

6. The printed circuit board of claim 4, wherein the heat releasing member comprises a conductive paste.

7. A structure comprising a printed circuit board, the printed circuit board comprising:
   first and second insulating layers forming a cavity;
   a circuit layer formed on the first insulating layer in the cavity; and
   a heat releasing layer disposed in contact with the circuit layer and the first and second insulating layers in the cavity,
   wherein the heat releasing layer comprises a conductive metal, is electrically connected to the circuit layer, contacts a ground pattern of the circuit layer, and encapsulates the ground pattern.

* * * * *